United States Patent
Morgan

(10) Patent No.: US 6,525,603 B1
(45) Date of Patent: Feb. 25, 2003

(54) FEEDFORWARD AMPLIFIER LINEARIZATION ADAPTING OFF MODULATION

(75) Inventor: Denny Edward Morgan, San Diego, CA (US)

(73) Assignee: Remec, Inc., San Diego, CA (US)

(*) Notice: Subject to any disclaimer, the term of this patent is extended or adjusted under 35 U.S.C. 154(b) by 0 days.

(21) Appl. No.: 09/756,038

(22) Filed: Jan. 5, 2001

(51) Int. Cl.[7] .................................................. H03F 3/66
(52) U.S. Cl. ......................................... 330/52; 330/151
(58) Field of Search ............................ 330/52, 149, 151

(56) References Cited

U.S. PATENT DOCUMENTS

| | | | |
|---|---|---|---|
| 4,389,618 A | 6/1983 | Bauman | 330/149 |
| 4,394,624 A | 7/1983 | Bauman | 330/151 |
| 4,580,105 A | 4/1986 | Myer | 330/149 |
| 4,885,551 A | 12/1989 | Myer | 330/52 |
| 5,077,532 A | 12/1991 | Obermann et al. | 330/151 |
| 5,148,117 A | 9/1992 | Talwar | 330/151 |
| 5,155,448 A | 10/1992 | Powell | 330/149 |
| 5,166,634 A | 11/1992 | Narahashi et al. | 330/151 |
| 5,307,022 A | 4/1994 | Tattersall, Jr. et al. | 330/52 |
| 5,323,119 A | 6/1994 | Powell et al. | 330/151 |
| 5,327,096 A | 7/1994 | Sakamoto et al. | 330/151 |
| 5,386,198 A | 1/1995 | Ripstrand et al. | 330/52 |
| 5,455,537 A | 10/1995 | Larkin et al. | 330/52 |
| 5,489,875 A * | 2/1996 | Carvers | 330/151 |
| 5,491,454 A * | 2/1996 | Matz | 330/151 |
| 5,576,659 A | 11/1996 | Kenington et al. | 330/52 |
| 5,617,061 A * | 4/1997 | Fukuchi | 330/52 |
| 5,742,201 A | 4/1998 | Eisenberg et al. | 330/2 |
| 5,760,646 A | 6/1998 | Belcher et al. | 330/149 |
| 5,770,971 A * | 6/1998 | McNicol | 330/52 |
| 5,808,512 A * | 9/1998 | Bainvoll et al. | 330/151 |
| 5,892,397 A | 4/1999 | Belcher et al. | 330/149 |
| 5,986,499 A * | 11/1999 | Myer | 330/52 |
| 5,999,048 A * | 12/1999 | Zhou | 330/52 |
| 6,029,285 A | 2/2000 | Belcher et al. | 3/149 |
| 6,078,216 A * | 6/2000 | Proctor, Jr. | 330/151 |
| 6,091,297 A * | 7/2000 | Bar-David et al. | 330/149 |
| 6,157,254 A * | 12/2000 | Myer | 330/151 |
| 6,188,732 B1 * | 2/2001 | Rha | 330/149 |
| 6,259,319 B1 * | 7/2001 | Ghanadan et al. | 330/151 |
| 6,275,105 B1 * | 8/2001 | Ghannouchi et al. | 330/151 |

FOREIGN PATENT DOCUMENTS

| | | |
|---|---|---|
| EP | 0367457 | 10/1989 |
| EP | 0367458 | 10/1989 |
| EP | 0466123 | 7/1991 |
| EP | 0758163 | 7/1996 |
| WO | 9728598 | 8/1997 |
| WO | 9737427 | 10/1997 |
| WO | 9804034 | 1/1998 |

OTHER PUBLICATIONS

Gupta, K.C. Computer–Aided Design of Microwaves Circuits Dedham, Mass: Artech, 1981. pp. 544–547.

Rey, C.G. and E. Clark "Linearization Performance for a Polar Work Function Predistorter," Proceedings RAWCON' 98 1998 IEEE Radio and Wireless Conference, Colorado Springs, CO USA, Aug. 9–12, 1998. pp. 325–328.

Webb et al. "Linearisation by Predistortion." Chapter 4.5.2 of Modern Quadrature Amplitude Modulation: Principles and Applications for Fixed and Wireless Communications New York: IEEE Press, 1994. pp. 128–139.

* cited by examiner

Primary Examiner—Robert Pascal
Assistant Examiner—Khanh Van Nguyen
(74) Attorney, Agent, or Firm—Heller Ehrman White & McAuliffe

(57) ABSTRACT

A feedforward amplifier is linearized by adapting off the detection of an applied modulation source. The feedforward amplifier has two loops: a first loop and a second loop. Modulators in the two loops are adjusted by controllers that adapt in response to detection of the modulation source injected into the first loop.

27 Claims, 6 Drawing Sheets

FEEDFORWARD AMPLIFIER LINEARIZATION ADAPTING OFF MODULATION

BACKGROUND OF THE INVENTION

1. Field of the Invention

This invention relates generally to radio frequency amplifiers and, more particularly, to radio frequency amplifiers having feedforward for reduction of distortion.

2. Description of the Related Art

Radio frequency (RF) amplifiers are used in a wide variety of applications, including communications. Ideally the transfer function of an RF amplifier is linear, with the output of the amplifier being an amplified replica of the input to the amplifier. However, RF amplifiers typically have some degree of non-linearity in their transfer function, particularly at high power levels. This non-linearity in an RF amplifier produces distortion in the RF amplifier output.

One approach used to reduce the distortion during RF power amplification is the feedforward amplifier. In a feedforward amplifier the instantaneous difference between a sample of the amplifier input signal and a sample of the amplifier output signal is measured. The difference signal is then amplified and subtracted from the RF power amplifier output, the amount of amplification being such as to cancel the existing distortion of the RF power amplifier.

FIG. 1 is a block diagram of a conventional feedforward amplifier 100. An input signal is coupled to an input directional coupler 101. The input directional coupler 101 divides the input signal sending a main portion of the input signal to a main amplifier 102 via a first loop modulator 103, and a sample, or sense, portion to a first loop delay 104. The main amplifier 102 amplifies the portion of the input signal routed to it. Amplification of the input signal by the main amplifier 102 produces distortion in the signal output from the main amplifier 102. The output of the main amplifier 102 is routed through a first loop sampling directional coupler 106 to a second loop delay 108.

The first loop directional coupler 106 extracts a sample of the output of the main amplifier 102 and routes the sample to a power combiner 110. The other input to the power combiner 110 is the sense portion of the input signal output from the first loop delay 104. The delay the sense portion of the input signal experiences as it passes through the first loop delay 104 is selected to match the delay experienced by the main portion of the input signal as it passes through the first loop modulator, the main amplifier 102 and the distortion sampling directional coupled 106. The power combiner 110 destructively sums the two signals at its inputs. Thus, because the two inputs to the power combiner 110 are a sample of the original input signal and a sample of the input signal plus the distortion introduced by the main amplifier 102, the power combiner 110 output is the distortion of the main amplifier 102. The first loop modulator 103 may be used to adjust the amplitude and phase of the signal routed to the main amplifier 102 to minimize the amount of input signal (carrier) at the power combiner 110 output.

The output of the power combiner 110 is coupled to a second loop modulator 111. The second loop modulator 111 adjusts the amplitude to a level to match the distortion level out of the main amplifier 102, and the phase is adjusted to be 180° out of phase with the main amplifier 102 output, when combined in a distortion canceling directional coupler 114. The output of the second loop modulator 111 is routed to an error amplifier 112. The error amplifier 112 buffers the output of the second loop modulator 111. The error amplifier 112 output is combined with the main amplifier 102 output from the second loop delay 108 in a distortion canceling directional coupler 114. The delay experienced by the signal passing through the second loop delay 108 is selected to match the delay experienced by the signal passing through the power combiner 110 and the error amplifier 112. Thus, the output of the distortion canceling directional coupler 114 is a substantially non-distorted replica of the input signal.

Typical problems in conventional feedforward amplifiers, as illustrated in FIG. 1, are that the amplifier performance is dependent on component characteristics and tolerances that affect the gain and phase of the device. In particular, proper operation of the feedforward amplifier requires that proper gain and phase be maintained for the feedforward signal to effectively cancel the distortion present in the main amplifier output. Thus, variations due to, for example, component age, component tolerance, or operating conditions such as temperature, power supply voltage, operating frequency, and humidity, may adversely affect the performance of the feedforward amplifier. In addition, there is no feedback to allow adjustments to correct for errors introduced by the components.

FIG. 2 is a block diagram of an improved feedforward amplifier 115 incorporating a pilot signal. Incorporating a pilot signal into the conventional feedforward amplifier 100 addresses several of the problems associated with the conventional feedforward amplifier 100. In the improved feedforward amplifier 115, a test signal, or pilot signal, is inserted into the signal path before the first loop modulator 103 and the main amplifier 102 via a pilot signal directional coupler 116. In the pilot signal directional coupler 116 the pilot signal is mixed with the main portion of the input signal before delivery to the first loop modulator 103 and the main amplifier 102.

The main amplifier 102 output, containing the pilot signal, is routed through the second loop delay 108 and is then sampled by an output sampling directional coupler 118. The output sampling directional coupler is connected to a pilot detector 120. The pilot detector 120 selectively detects the pilot signal present in the improved feed forward amplifier 115 output. For example, the detector may be a bandpass filter with a center frequency at the pilot signal frequency followed by an envelope detector. The output of the pilot detector 120 represents the amplitude of the pilot signal present in the output of the improved feedforward amplifier 115. The pilot detector 120 output is routed to a second loop controller 122.

As in the conventional feedforward amplifier illustrated in FIG. 1, the output of the main amplifier 102 is sampled by the first loop directional coupler 106 and routed to the power combiner 110. In the improved feedforward amplifier 115, the two inputs to the power combiner 110 are a sample of the main amplifier 102 output, with distortion and the pilot signal, and a sample of the original input signal. Thus the power combiner 110 output is the distortion of the main amplifier 102 plus the pilot signal. The first loop delay 104 is selected to match the delay introduced by the pilot signal directional coupler 116, the main amplifier 102, and the first loop directional coupler 106. As described above the first loop modulator 103 may be used to adjust the amplitude and phase of the signal routed to the main amplifier 102 to minimize the distortion of the main amplifier 102.

The output of the power combiner 110 is routed to a second loop modulator 124. The second loop modulator 124 modifies the amplitude and phase of the output of the power combiner 110 as commanded by the second loop controller 122. The output of the second loop modulator 124 is routed to the error amplifier 112. As discussed in relation to the conventional feedforward amplifier 100 illustrated in FIG. 1, the error amplifier output is routed to a distortion canceling directional coupler 114 and is combined with the main amplifier 102 output.

The second loop controller 122 commands the second loop modulator 124 to adjust the amplitude and phase of the power combiner 110 output to minimize the amplitude of the pilot signal present in the improved feedforward amplifier 115 output, as measured by the detector 120. The pilot signal behaves the same as the distortion introduced by the main amplifier 102. Thus, minimization of the pilot signal present in the improved feedforward amplifier 115 output also minimizes the presence of distortion introduced by the main amplifier 102 in the amplifier output.

The use of a pilot signal in a feedforward amplifier addresses some of the problems of conventional feedforward amplifiers by providing a feedback mechanism to compensate for errors introduced by component variations. However, several disadvantages still exist because of the pilot signal used. For example, if a single tone, or frequency hopping, pilot signal is used then the feedforward amplifier optimization is based at the particular frequency of the pilot tone, not the particular frequency bands being amplified by the feedforward amplifier. If a broadband signal, such as a noise or spread spectrum signal, is used as a pilot signal, then the feedforward amplifier optimization is based on the entire frequency band of the broadband signal, not the particular frequency bands being amplified by the feedforward amplifier. In both these examples the optimization of the feedforward correction is not optimal because it is not based on the particular frequency bands that are being amplified by the feedforward amplifier.

From the discussion above, it should be apparent that there is a need for a system that can provide linearization of a feedforward amplifier that is adapted in response to the particular frequency bands being amplified by the feedforward amplifier.

SUMMARY OF THE INVENTION

A method and apparatus for reducing distortion in the output of a feedforward amplifier includes a first and second loop. The first loop includes a modulation source, and is configured to accept an input signal. The input signal is then modulated with the modulation source. The first loop outputs a modulated signal.

The second loop is configured to accept the modulated signal output from the first loop. The second loop includes detection of the presence of the modulation source in the modulated signal. An error signal is generated in response to the detected modulation source. The error signal is summed with the modulated signal to minimize the presence of the modulation source in the modulated signal.

DETAILED DESCRIPTION

A feedforward amplifier is adapted, or linearized, off a modulating source. The feedforward amplifier has two loops: a first, or comparison loop; and a second, or cancellation loop. Modulators in the two loops are adjusted by controllers that adapt the modulators operation in response to detection of a modulation source signal injected into the first loop.

Feedforward Amplifier Topology

Figure 3:
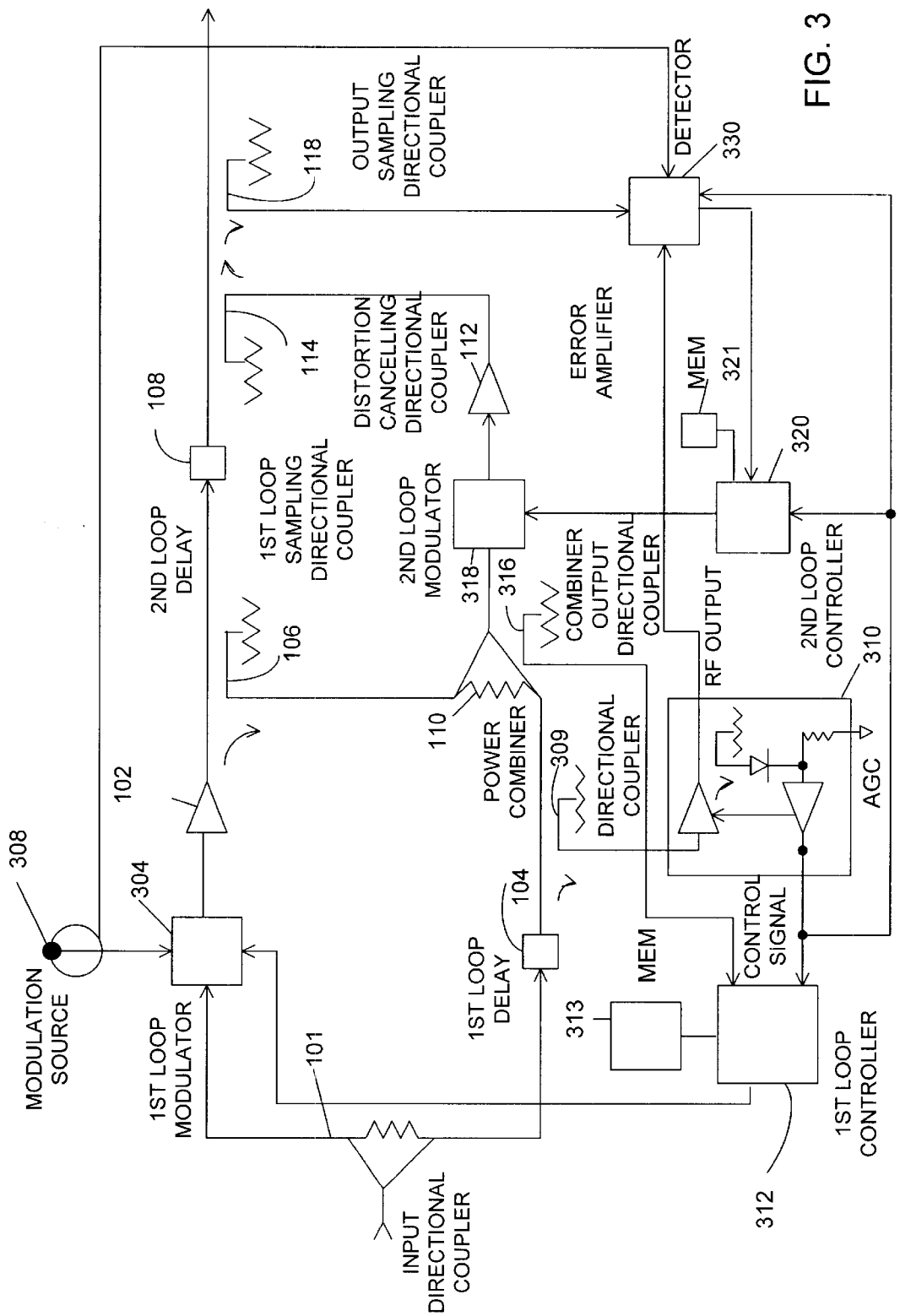
FIG. 3 is a block diagram of one embodiment of a feedforward amplifier constructed in accordance with the invention.

FIG. 3 is a block diagram of one embodiment of a feedforward amplifier in accordance with the invention. An input signal is coupled to the input directional coupler 101. Directional couplers are also referred to as power splitters or power dividers. The input directional coupler 101 divides the input signal sending a main portion of the input signal to a first loop modulator 304, and a sample, or sense, portion to a first loop delay 104. The first loop modulator 304 also receives an input from a modulation source 308. The first loop modulator 304 modulates the input signal with the modulating source 308 signal. The first loop modulator 304 also receives an input from a first loop controller 312 discussed in detail below.

Figure 1:
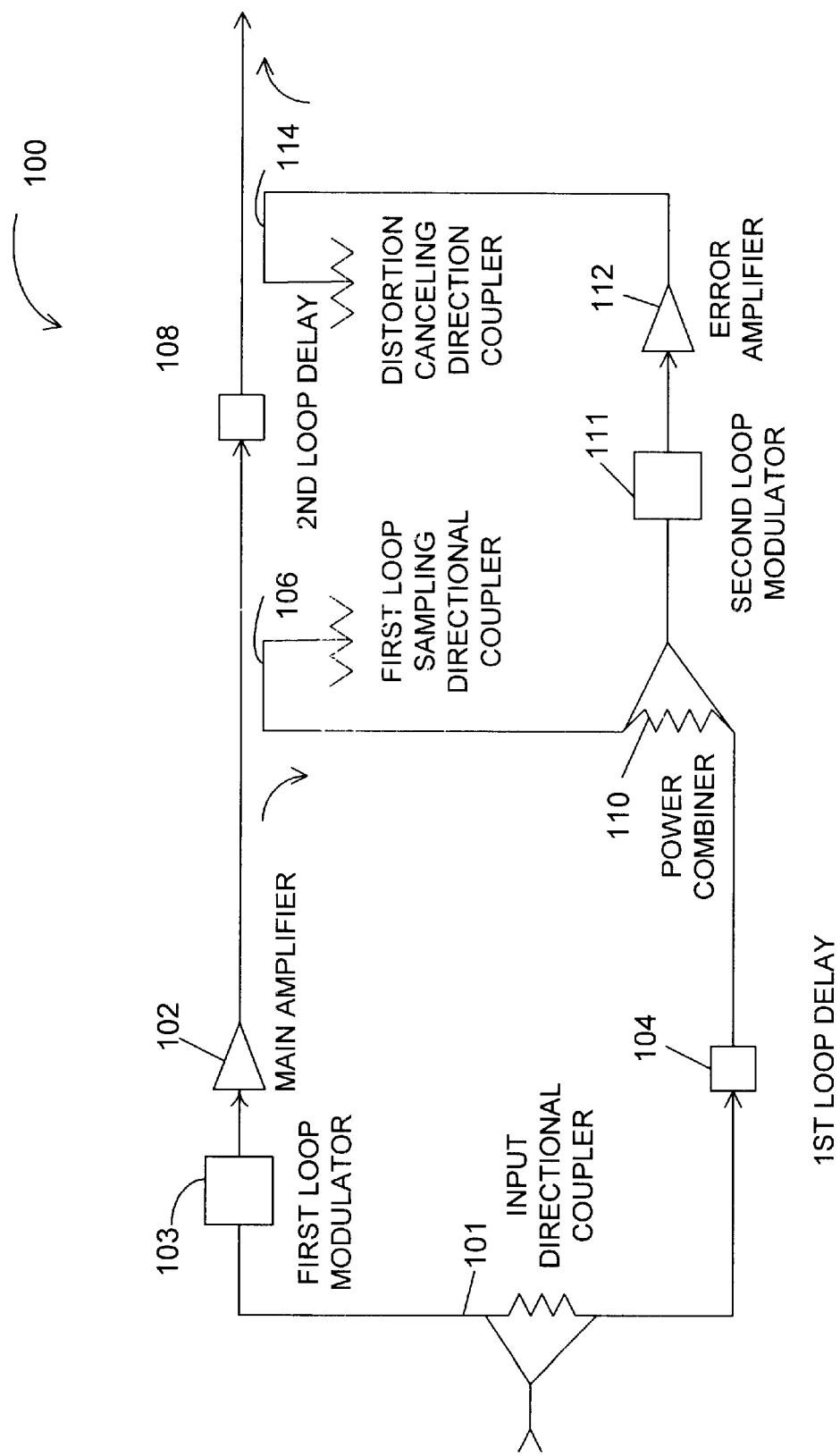
FIG. 1 is a block diagram of a conventional feedforward amplifier.
Figure 2:
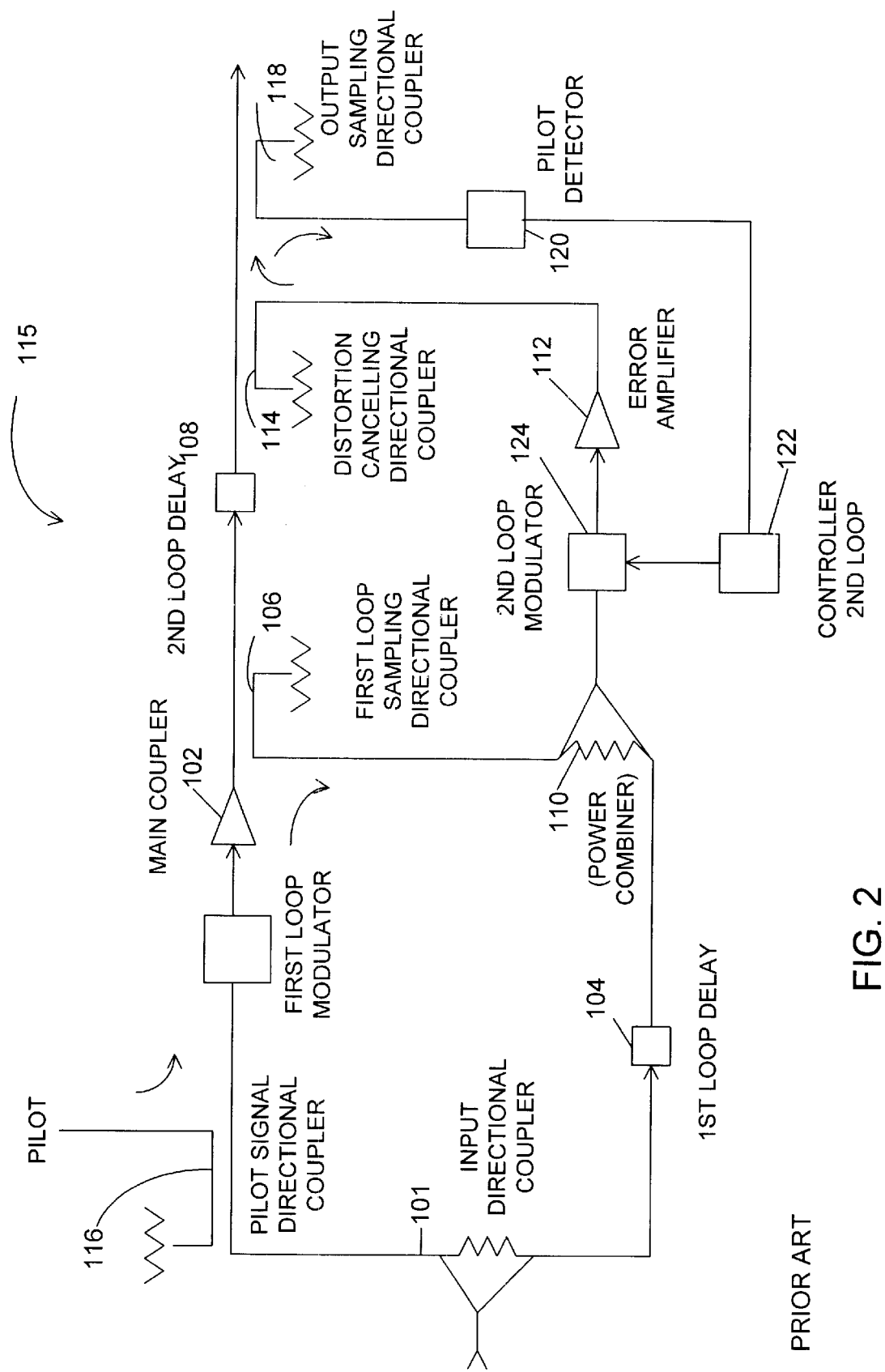
FIG. 2 is a block diagram of a conventional feedforward amplifier improved by incorporating a pilot signal.

Thus, in contrast to adding a pilot signal with the input signal (FIG. 2), in FIG. 3 the input signal is instead modulated. As further discussed below, the presence of the modulation signal in the output of the feedforward amplifier is minimized. Using modulation for adapting the feedforward amplifier rather than a pilot signal provides several advantages. For example, if a continuous tone pilot signal is used, even a tone that "hops" frequency, only the narrow portion of the spectrum occupied by the tone is used in adaptation of the feedforward amplifier. If a wideband signal is used as a pilot signal, such as a noise signal or a CDMA signal, then adaptation of the feedforward amplifier is based on an average of the entire spectrum, not the portion of the spectrum being used for communication.

In contrast, injecting modulation on the input signal allows adaptation off of the input signal itself, thereby adapting the feedforward amplifier for the portion of the spectrum used by the input signal. In addition, there is no requirement to know what portion of the spectrum the input signal will occupy. This is an advantage because as the input signal changes, using different portions of the spectrum, the adaptation automatically tracks the changes. Also, the input signal to the feedforward amplifier may include multiple signals at different amplitudes. Injecting modulation on the input signal allows adaptation that automatically compensates for the different signal amplitudes, or levels, present in the spectrum, thereby "weighting" the adaptation of the feedforward amplifier in favor of any larger signals present in the input signal.

Various parameters of the input signal may be modulated by the first loop modulator 304. For example, the first loop modulator 304 may modulate the phase, or the amplitude, or both the phase and amplitude of the input signal. For example, the first loop modulator 304 may be used to adjust the phase and amplitude of the first loop for carrier suppression. In addition, other types of modulation of the input signal may be performed, for example, single-sideband. A particular advantage when using phase modulation is that there is not an increase in the peak to average power ratio. Peak to average power ratio is important for linearity in an amplifier. For example, if the peaks of a signal are greater than the peak power capability of the amplifier, then signal clipping occurs, causing severe distortion of the output signal creating intermodulation distortion and spectral regrowth.

The first loop modulator 304 may be constructed, for example, as a separate phase modulator, or phase shifter, and an amplitude modulator, such as a variable attenuator or variable gain amplifier. In addition, the first loop modulator may be a vector, or In-phase/Quadrature (I/Q), modulator. An I/Q modulator may be implemented using either PIN diodes or GaAs FETs. PIN diodes typically have superior distortion properties, while GaAs FETs have faster response time and generally are lower in cost if implemented in monolithic microwave integrated circuits (MMICs).

The output of the first loop modulator 304 is routed to the main amplifier 102 where it is amplified. The amplification of the modulated signal introduces distortion in the signal output from the main amplifier 102. The output of the main amplifier is routed through first loop directional coupler 106 to second loop delay 108. In one embodiment, the main amplifier 102 is a class-AB LDMOS amplifier. This embodiment typically yields good efficiency and moderate distortion at large signal levels. In general, the main amplifier may be, for example, a class A, class B, a class AB or a class C amplifier. In addition, the main amplifier may be fabricated using any of the various transistor families, for example, FET, MOSFET, GaAs FET, LDMOS, VFET, or Bipolar.

The first loop directional coupler 106 extracts a sample of the output of the main amplifier 102 and routes the sample to the power combiner 110. The other input to the power combiner 110 is the sense portion of the input signal from the first loop delay 104. The first loop delay 104 is selected so as to match the delay of the portion of the input signal that passes through the first loop modulator 304, main amplifier 102 and first loop directional coupler 106. In one embodiment, the first loop delay 104 is a coaxial cable. In another embodiment, the first loop delay 104 is a bandpass filter structure.

Thus, the two inputs to the power combiner 110 are the delayed original input signal, and the sampled modulated input signal plus the distortion introduced by the main amplifier 102. The power combiner 110 destructively combines the modulated input signal plus the distortion with the sample of the original signal. Therefore, the power combiner 110 output is the modulation signal plus the distortion introduced by the main amplifier 102.

A portion of the sense signal from the first loop delay 104 is extracted by an input signal level directional coupler 309. The signal extracted by the input signal level directional coupler 309 is routed to an automatic gain control (AGC) 310. Operation of the AGC is more fully described below.

The output of the power combiner 110 is coupled to a second loop modulator 318 through a power combiner output directional coupler 316. The portion of the power combiner 110 output extracted by the power combiner output directional coupler 316 is routed to a first loop controller 312. The operation of the first loop controller is more fully described below. In one embodiment, the first loop controller 312 includes memory which is used to store instructions for the controller during operation. In addition, the first loop controller may include an analog to digital converter. In another embodiment, there is a separate memory 313 where instructions for the first loop controller are stored. Furthermore, there may be analog to digital converters separate from the first loop controller 312.

The second loop modulator 318 may modulate various parameters of the power combiner 110 output before providing the signal to an error amplifier 112. The second loop modulator 318 may be made as, for example, a separate phase modulator, or phase shifter, and an amplitude modulator, such as a variable attenuator or variable gain amplifier. In addition, the second loop modulator 318 may be an a vector, or I/Q, modulator. The second loop modulator 318 may modulate the phase, or amplitude, or both the phase and amplitude of the power combiner 110 output. For example, the gain and the phase of the power combiner output 110 may be adjusted so that the second loop modulator 318 output is equal in amplitude and 180° out of phase with the distortion present in the main amplifier output 102.

The second loop modulator 318 is adjusted by a second loop controller 320. Operation of the second loop controller is described more fully below. In one embodiment, the second loop controller 320 includes memory which is used to store instructions for the controller during operation. In addition, the second loop controller may include an analog to digital converter. In another embodiment, there is a separate memory 321 where instructions for the second loop controller are stored. Furthermore, there may be analog to digital converters separate from the second loop controller 320. Also, the memory 313 for the first loop controller and the memory 321 for the second loop controller may be the same memory.

The output of the second loop modulator 318 is routed to an error amplifier 112. The error amplifier 112 provides additional electrical drive capabilities to the second loop modulator 318 output so as to match the distortion level out of the main amplifier 102. Typically, the error amplifier 112 is designed for minimum distortion at low signal levels at the expense of efficiency. In one embodiment, the error amplifier 112 is a class-A GaAs FET or LDMOS amplifier. The error amplifier 112 output is combined with the main amplifier output from the delay 108 in the distortion canceling directional coupler 114.

The second loop delay 108 is selected to match the total delay experienced by the signal that traversed through the power combiner 110, the power combiner directional coupler 316, the second loop modulator 318, and the error amplifier 112. In one embodiment, the delay is a coaxial cable. In another embodiment, the delay is a bandpass filter structure.

Typically, the second loop modulator 318 and the error amplifier 112 adjust the signal out of the power combiner 110 such that the error amplifier 112 output matches the distortion present in the output of the second loop delay 108. Thus when the error amplifier 112 output is destructively combined with the second loop delay 108 in the distortion canceling directional coupler 114, an output signal is produced that is, ideally, a non-distorted, amplified, replica of the input signal.

The output of the distortion canceling directional coupler 114 is routed to an output sampling directional coupler 118, which extracts a portion of the feedforward amplifier output. The portion of the feedforward amplifier signal extracted by the directional coupler 118 is routed to a detector 330. The detector 330 selectively detects the presence of the applied modulation in the output of the feedforward amplifier.

Detection of the applied modulation by the detector may be accomplished in several ways. For example, the detector may include a downconverter and a synchronous detector. The detector 330 is discussed in further detail below.

Adaptation

As described above, even minor changes in phase or amplitude may seriously limit the distortion cancellation performance of a conventional feedforward amplifier. Changes in phase or amplitude may result, for example, from temperature, component aging, variations in power supply voltage, variations in the RF power level, and operating frequency. Changes in phase or amplitude can significantly degrade the performance of the feedforward amplifier. To accommodate for changes an adaptive controller is used. For convenience of discussion FIG. 3 illustrates a first loop controller 312 and a second loop controller 320. In one embodiment, there are two separate controllers. It should be understood that the first loop controller and second loop controller may be constructed as a single controller that performs both functions. The controller(s) may be, for example, an application specific integrated circuit (ASIC), a microprocessor, a microcontroller, a field programmable gate array (FPGA), or discrete analog components. For example, the controller may be a MICROCHIP model PIC17F876-20, or similar device.

In one embodiment, the first loop controller 312 adjusts the phase and amplitude of the first loop modulator 304. The first loop controller 312 receives a sample of the power combiner 110 output extracted via the power combiner directional coupler 316. The first loop controller 312 adjust the phase and amplitude of first loop modulator to minimize the detected power extracted from the power combiner 110. Detection of the power combiner 110 output by the first loop controller 312 may be performed by either a synchronous detector or a non-synchronous detector, for example a conventional diode detector.

The first loop controller 312 also receives an input from the AGC 310. The AGC 310 receives an input from the input signal level directional coupler 309. The signal received from the input signal directional coupler is routed to a variable gain amplifier in the AGC 310. The output of the variable gain amplifier is routed to the detector 330. The output of the variable gain amplifier is also detected in the AGC 310, where it is integrated. The output of the integrator, the control signal or AGC level, adjusts the gain of the variable gain amplifier, and is also routed to the first loop controller 312, second loop controller 320 and detector 330.

In one embodiment, the first loop controller 312 senses the control signal of the AGC 310 and stops adapting if the output signal becomes too low. For example, if there is no input signal the first loop controller stops adapting rather than adapt off of noise. In addition, the adaptation rate can be adjusted in response to the AGC level. For example, if the AGC level increases, indicating a higher received signal strength, then the adaptation rate can be increased and thereby decrease the time required to determine adequate adaptation parameters. If the AGC level decreases, indicating a lower received signal strength, then the adaptation can be slowed, or retarded, to ensure adequate time for determining adequate adaptation parameters.

The AGC may be used to maintain a constant loop gain. While maintaining a constant loop gain may be advantageous, the AGC adds expense to the feedforward amplifier. Therefore, in less critical applications it may be advantageous not to include an AGC and therefore have a less expensive feedforward amplifier.

In one embodiment, the second loop controller 320 adjusts the amplitude and phase of the second loop modulator 318 in response to the output of the detector 330. As described above, the output sampling directional coupler 118 extracts a portion of the output of the feedforward power amplifier and routes it to the detector 330. The detector 330 is configured to selectively detect the modulation applied by the modulation source 308 present in the output of the feedforward amplifier.

Figure 4:
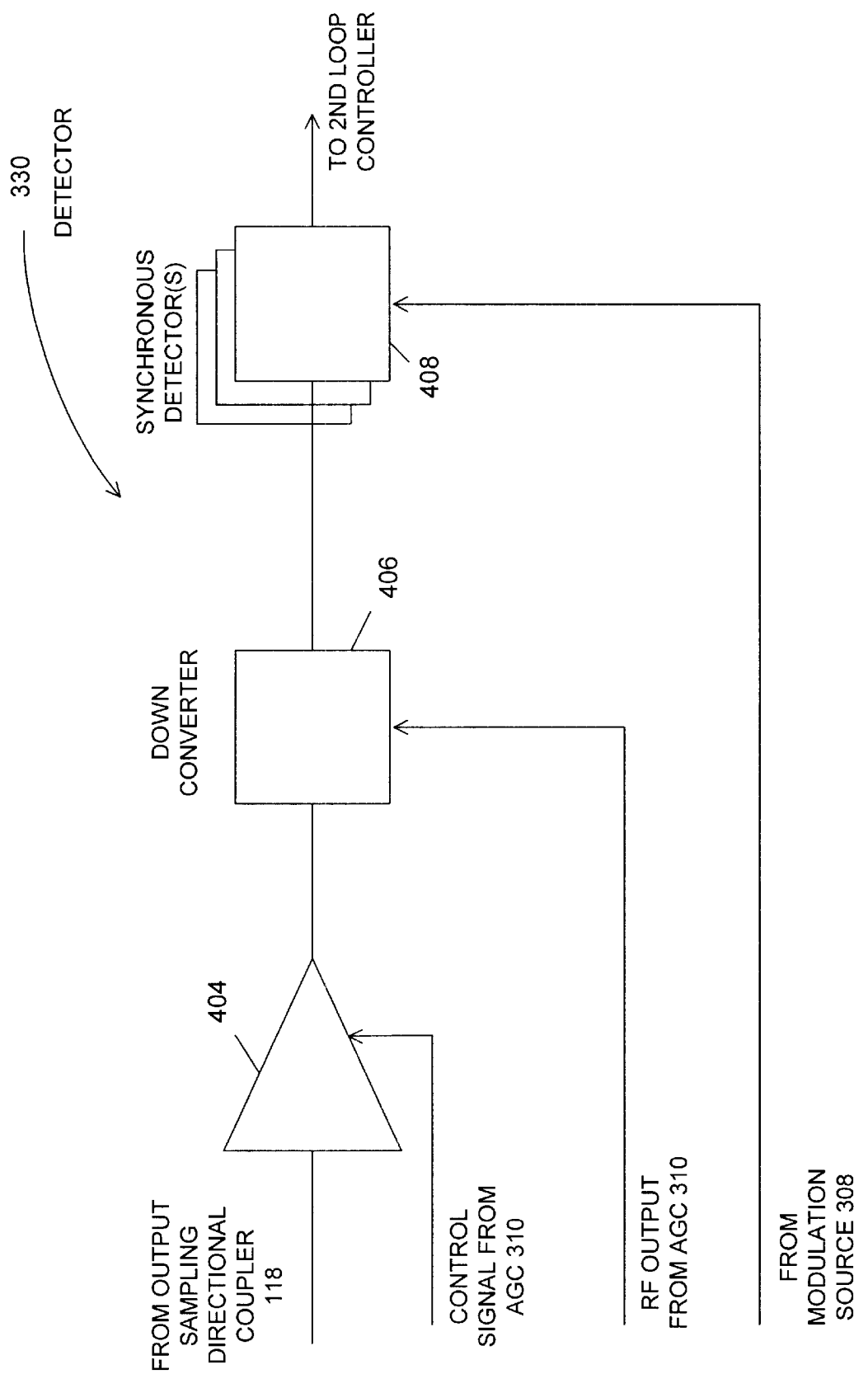
FIG. 4 is a block diagram showing additional details of the detector of the feedforward amplifier of FIG. 3.

FIG. 4 is a block diagram of one embodiment of the detector 330. The sense portion of the feedforward amplifier output, from output sampling directional coupler 118, is connected to a variable gain amplifier 404. The gain of the variable gain amplifier 404 is controlled by the AGC 310 control signal level, thereby providing a constant loop gain to the control loop. The output of the variable gain amplifier 404 is connected to a down converter 406. In one embodiment, the variable gain amplifier 404 is implemented as an MMIC. In other embodiments, the variable gain amplifier 404 is implemented as a combination of variable attenuator(s) and amplifier(s).

The down converter 406 uses a portion of the input signal, that has had its level adjusted by the AGC 310, to down convert the output of the variable gain amplifier 404 to a baseband signal. Typically, the baseband signal output by the down converter 406 contains a large amount of noise and a small amount of the modulation source signal. In one embodiment, the down converter 406 is implemented using double balanced diode mixers. The output of the down converter 406 is connected to a synchronous detector 408. Synchronous detector block 408 in FIG. 4 may include a single synchronous detector or a plurality of synchronous detectors. A sample of the modulation source is also connected to the synchronous detector, where it is mixed with the output of the down converter 406 to produce the detector 330 output. The detector 330 output is connected to the second loop controller 320.

Figure 5:
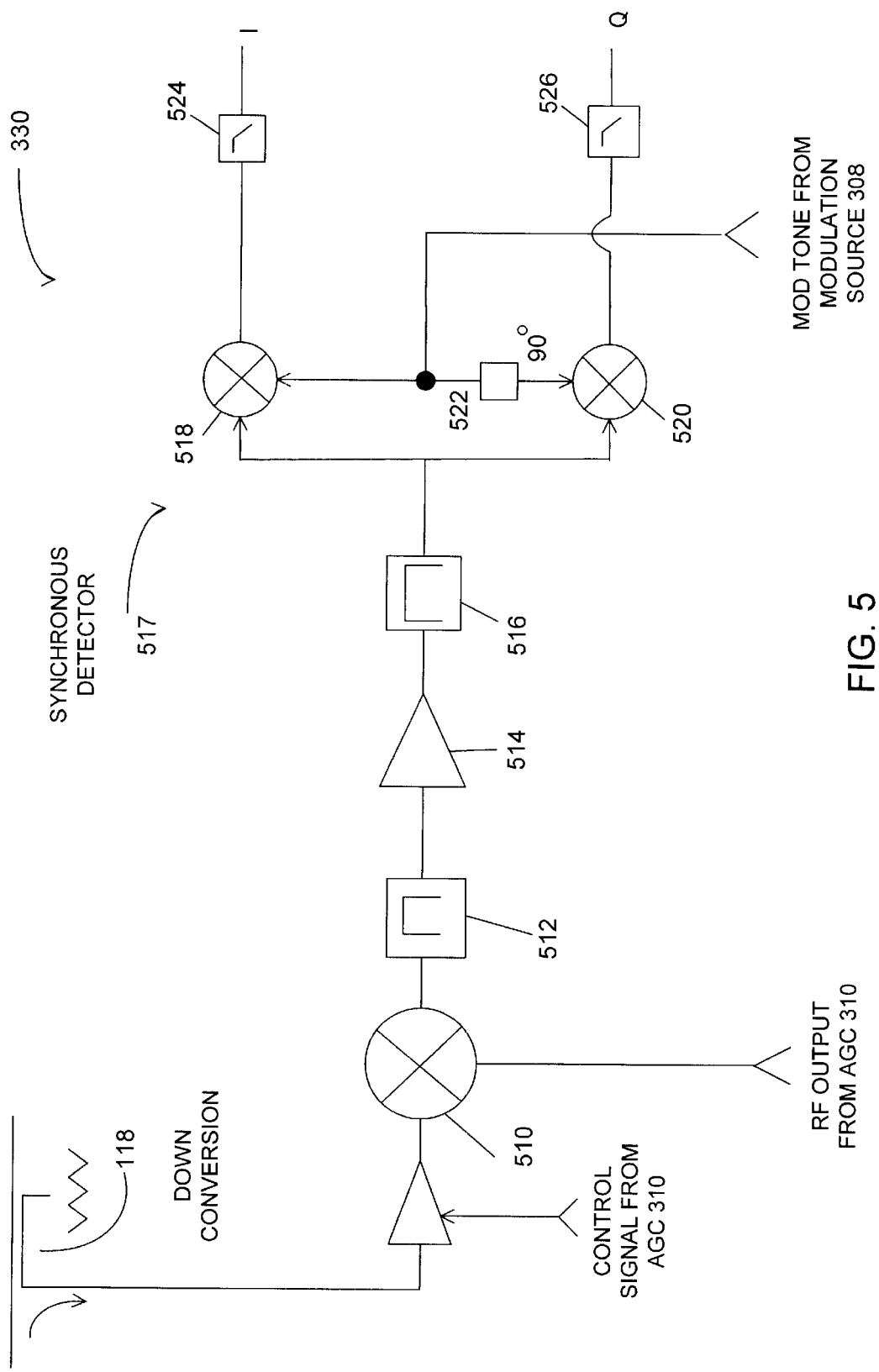
FIG. 5 is a block diagram of an embodiment of the detector of FIG. 4 adapted for detection of a sin side band modulation source.

FIG. 5 illustrates one embodiment of the detector 330 adapted for detection of a single side band modulation source. The detector includes a mixer 510 used to down-convert the amplified signal. One input to the mixer 510 is the output of the sampling directional coupler 118 which is mixed with a sample of the RF input signal from the AGC 310. The output of the mixer 510 is a baseband signal. The output of the mixer 510 is connected to a first band pass filter 512, an amplifier 514, and a second bandpass filter 516. This combination of bandpass filters 512 and 516 are to prevent signal overload. Overload can occur because the modulation level can vary greatly during amplifier operation. For example, the modulation level may be initially at a typical level of −30 dBc when there is no adaptation occurring. During adaptation the modulation level may be suppressed to a level of 30 db to 40 dB below this initial level which may be lower than the level of the downconverted intrinsic modulation and noise. The bandpass filters can be fabricated, for example, as active filters using operational amplifiers, resistor and capacitors, or using passive components. In addition, the filters may be digital filters implemented, for example, in an ASIC, a microprocessor, a microcontroller, an FPGA, or a digital signal processor (DSP) chip. The Amplifier 514 is used to amplify the very weak modulation source signal to an adequate level for detection.

The output of bandpass filter 516 is connected to a synchronous detector 517. The synchronous detector includes a first mixer 518 and a second mixer 520. The output of the bandpass filter 516, which is the baseband signal with modulation, is connected to one input to each of the first mixer 518 and second mixer 520. The second input to the first mixer 518 is the modulation signal from the modulation source 308. Thus the output of the first mixer 518 is the in-phase, or I component of the baseband signal. The input of the second mixer 520 is the modulation signal from the modulation source 308 after it has been shifted 90° by a phase shifter 522. Thus the output of the second mixer 520 is the quadrature, or Q, signal of the baseband signal. The output of first mixer 518 is connected to an I lowpass filter 524 and the output of the second mixer 520 is connected to a Q lowpass filter 526. The output of the I lowpass filter 524 and the Q lowpass filter 526 are connected to the second loop controller 320. The synchronous detector 330 may be implemented, for example, using CMOS switches and operational amplifiers, or digitally by an analog to digital converter (ADC) and an ASIC, a microprocessor, a microcontroller, an FPGA, or a DSP.

Figure 6:
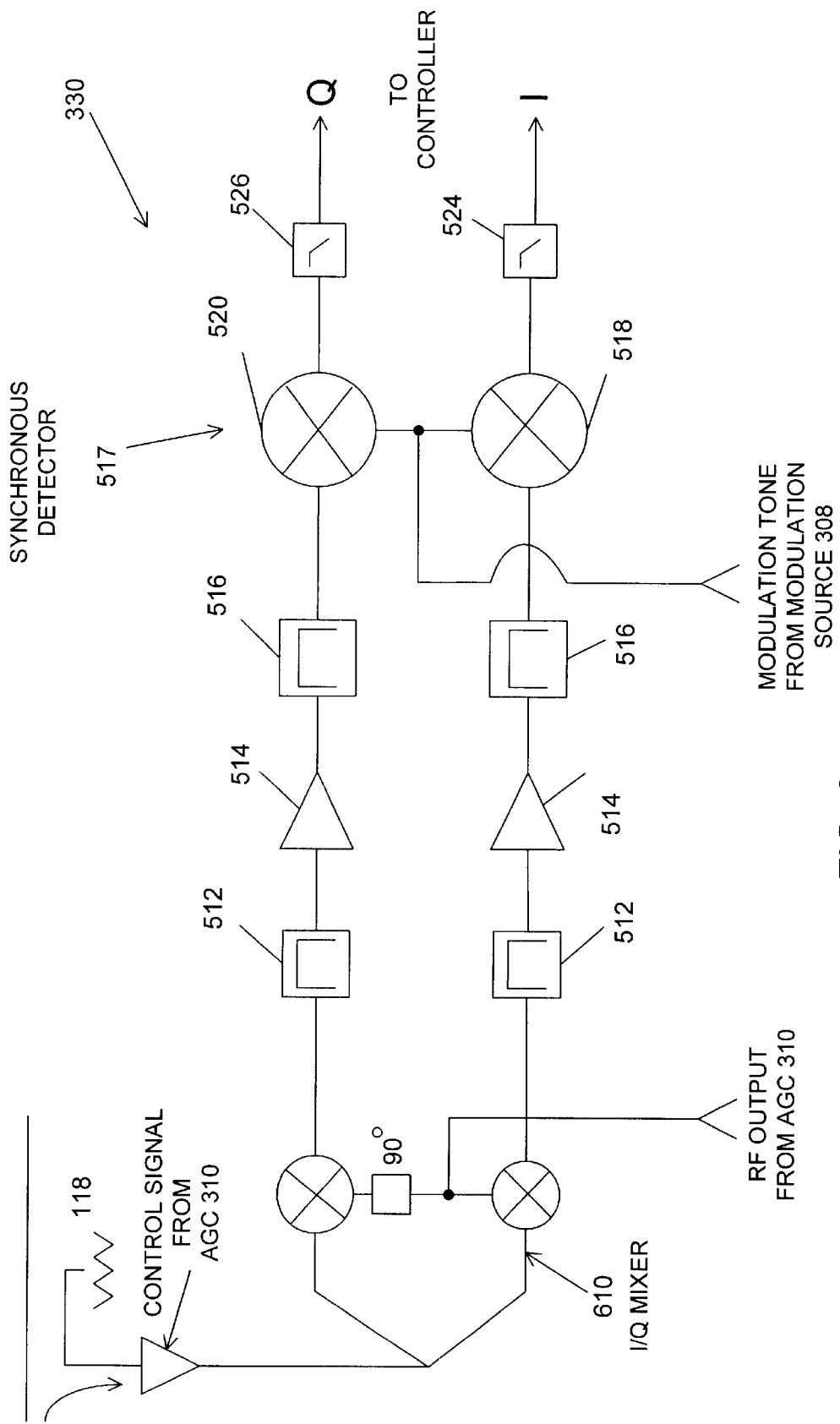
FIG. 6 is a block diagram of an embodiment of the detector of FIG. 4 adapted to include an In-phase/Quadrature (I/Q) mixer.

FIG. 6 illustrates another embodiment of the detector 330 suitable for amplitude modulation (AM) or phase modulation (PM). The FIG. 6 detector includes an I/Q mixer 610 that receives an input from output sampling directional coupler 118 and separates the signal into its I and Q components. The I and Q outputs of the I/Q mixer 610 are connected to separate bandpass filter 512, amplifier 514 and bandpass filter 516 networks as described above. The I and Q components are mixed with the modulation source in a synchronous detector 517 such as described above, and the output of the synchronous detector is lowpass filtered as described above. The I and Q outputs are connected to the second loop controller 320.

In one embodiment, the output of the detector 330 may be digitized by an ADC before being sent to the second loop controller 320. In another embodiment, the down conversion and synchronous detection are performed digitally by an ASIC, a microprocessor, a microcontroller, an FPGA, or a DSP, and the digital data is sent to the second loop controller.

Referring again to FIG. 3, the second loop controller 320 receives the output of the detector 330. In one embodiment, the second loop controller 320 adjusts operation of the second loop modulator 318 in response to the detector 330 output, so as to minimize the level of the modulation signal detected by the detector 320. Adjusting the second loop modulator 318 to minimize the modulation signal level present in the feedforward amplifier output also minimizes the distortion introduced by the main amplifier 102 because the cancellation conditions for the modulation and distortion are the same.

The second loop controller 320 also receives input from the AGC 310. Similarly to the first loop controller 312, discussed above, the second loop controller 320 uses the AGC signal to stop adaptation if the input signal level drops below a threshold.

In one embodiment, the first loop modulator 304 is constructed as a variable attenuator and a phase shifter. The modulation source 308 output is applied to the phase shifter. In this manner, the modulation source phase modulates the input signal. An advantage of phase modulation is that there is not an increase in the peak to average ratio of the signal presented to the main amplifier.

The first loop controller may determine the parameters for adjusting the phase and amplitude of the first loop modulator 304 using a sequential search method. One such technique is the "Hooke and Jeeves" method described in Computer-Aided Design of Microwave Circuits by Gupta et. al., at pages 544 through 546, incorporated in its entirety herein. In the sequential search method described by Hooke and Jeeves, two types of "moves" are made. The first type of move, an exploratory move, is made to "explore" the behavior of the function being evaluated. The second type of move, called a pattern move, evaluates the pattern direction identified in the first step. Using this technique the phase and amplitude of the first loop modulator are adjusted. If the distortion level out of the power combiner 316 improves then adjustments, or moves, in the same "direction" are made. The size of the moves are adjusted in response to the amount of improvement in the output of the power coupler 316.

In one embodiment, the second loop controller adjusts the adaptation parameters used by the second loop modulator using a sequential search method, such as the Hooke-Jeeves method described above. In another embodiment, a matrix of adaptation parameters is used. The matrix adjusts the sensitivity, or amount of adjustment of adaptation parameters, in response to the vector error versus phase and amplitude outputs of the detector sensing the presence of the modulating source in the feedforward amplifier output. In another embodiment, the matrix sensitivity derived from the vector error versus phase and amplitude outputs of the detector is fixed. In yet another embodiment, the matrix sensitivity is stored in a lookup table.

Modulation Source

As discussed above, injection of a modulation source offers many advantages in feedforward amplifier design. The modulation source may be implemented in many ways, for example, in one embodiment, the input signal is amplitude modulated (AM). In another embodiment, the input signal is single sideband modulated (SSBM) creating an additional sideband while retaining the carrier. Typically, the additional sideband(s) are between 20 dB and 40 dB below the carrier power level, for example −30 dBc. Generally, if SSBM is used, first loop modulator 304 may be a vector modulator.

A typical modulation source 308 may a be sinusoidal waveform with a frequency between 100 Hz to 10 kHz. Frequencies outside this range may be used, but may suffer reduced performance. For example, frequencies below 100 Hz may result in unacceptably slow adaptation of the control loop. Frequencies appreciably above 10 kHz may result in excessive out of band spurious signals being present in the feedforward amplifier output if not adequately cancelled by the second loop controller.

The frequency of the modulation source may be selected so that it corresponds to the spectral nulls of the input signal mixed with itself, which is equivalent to the detected input signal. For example, if the input signal is from a Global System Mobile (GSM) communication system, the modulation signal will be selected to be a harmonic of approximately 1.8 kHz, which is the reciprocal of the nominal 3 dB time slot width of 552.8 $\mu$sec. The advantage of this is improved signal to noise ratio (SNR) at the detector output.

As discussed above, typically, the modulation level is on the order of 30 dB below the desired signal level of the main amplifier. Different modulation levels may be used, but may suffer reduced performance. For example, modulation levels appreciably greater may cause unacceptable distortion by the error amplifier 112. Modulation levels appreciably lower may cause a reduced SNR at the output of the detector 330 connected to the second loop controller 320. A reduction in the SNR in the detector 330 output signal to the second loop controller 320 may result in an unacceptably long adaptation period, or poor adaptation, by the second loop controller 320.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

I claim:

1. A method of reducing distortion in a feedforward amplifier output signal, the method comprising:
   receiving an input signal;
   modulating the input signal with a modulation source signal;
   delivering the modulated input signal to a main amplifier to produce an output;
   extracting a sample of the output of the main amplifier;
   subtracting a sample of the input signal from the extracted sample of the output of the main amplifier thereby producing an error signal;
   detecting the presence of the modulation source signal in the output of the feedforward amplifier; and
   adaptively modulating and amplifying the error signal, and combining the modulated and amplified error signal with the main amplifier output so as to minimize the presence of the modulation source signal in the output of the feedforward amplifier;
   wherein the input signal is modulated to create a single additional sideband with a carrier signal maintained.

2. A method as defined in claim 1, wherein the single additional sideband is about 30 dB below the carrier single amplitude.

3. A method of reducing distortion in a feedforward amplifier output signal, the method comprising:
   receiving an input signal;
   modulating the input signal with a modulation source signal;
   delivering the modulated input signal to a main amplifier to produce an output;
   extracting a sample of the output of the main amplifier;
   subtracting a sample of the input signal from the extracted sample of the output of the main amplifier thereby producing an error signal;
   detecting the presence of the modulation source signal in the output of the feedforward amplifier; and
   adaptively modulating and amplifying the error signal, and combining the modulated and amplified error signal with the main amplifier output so as to minimize the presence of the modulation source signal in the output of the feedforward amplifier;
   wherein a single RF mixer is used to downconvert the feedforward amplifier output to a baseband signal.

4. A method of reducing distortion in a feedforward amplifier output signal, the method comprising:
   receiving an input signal;
   modulating the input signal with a modulation source signal;
   delivering the modulated input signal to a main amplifier to produce an output;
   extracting a sample of the output of the main amplifier;
   subtracting a sample of the input signal from the extracted sample of the output of the main amplifier thereby producing an error signal;
   detecting the presence of the modulation source signal in the output of the feedforward amplifier; and
   adaptively modulating and amplifying the error signal, and combining the modulated and amplified error signal with the main amplifier output so as to minimize the presence of the modulation source signal in the output of the feedforward amplifier;
   wherein an I/Q mixer is used to downconvert the feedforward amplifier output to a baseband signal.

5. A method of reducing distortion in a feedforward amplifier output signal, the method comprising:
   receiving an input signal;
   modulating the input signal with a modulation source signal;
   delivering the modulated input signal to a main amplifier to produce an output;
   extracting a sample of the output of the main amplifier;
   subtracting a sample of the input signal from the extracted sample of the output of the main amplifier thereby producing an error signal;
   detecting the presence of the modulation source signal in the output of the feedforward amplifier; and
   adaptively modulating and amplifying the error signal, and combining the modulated and amplified error signal with the main amplifier output so as to minimize the presence of the modulation source signal in the output of the feedforward amplifier;
   wherein a plurality of synchronous detectors are used to detect the presence of the modulation of the input signal in the output of the feedforward amplifier.

6. A method of reducing distortion in a feedforward amplifier output signal, the method comprising:
   receiving an input signal;
   modulating the input signal with a modulation source signal;
   delivering the modulated input signal to a main amplifier to produce an output;
   extracting a sample of the output of the main amplifier;
   subtracting a sample of the input signal from the extracted sample of the output of the main amplifier thereby producing an error signal;
   detecting the presence of the modulation source signal in the output of the feedforward amplifier; and
   adaptively modulating and amplifying the error signal, and combining the modulated and amplified error signal with the main amplifier output so as to minimize the presence of the modulation source signal in the output of the feedforward amplifier;
   wherein detecting the presence of the modulation source signal is performed using an I/Q mixer.

7. A method of reducing distortion in a feedforward amplifier output signal, the method comprising:
   receiving an input signal;
   modulating the input signal with a modulation source signal;
   delivering the modulated input signal to a main amplifier to produce an output;

extracting a sample of the output of the main amplifier;

subtracting a sample of the input signal from the extracted sample of the output of the main amplifier thereby producing an error signal;

detecting the presence of the modulation source signal in the output of the feedforward amplifier; and adaptively modulating and amplifying the error signal, and combining the modulated and amplified error signal with the main amplifier output so as to minimize the presence of the modulation source signal in the output of the feedforward amplifier;

wherein detecting the presence of the modulation source signal is performed using a plurality of synchronous detectors.

8. A method of reducing distortion in a feedforward amplifier output signal, the method comprising:

receiving an input signal;

modulating the input signal with a modulation source signal;

delivering the modulated input signal to a main amplifier to produce an output;

extracting a sample of the output of the main amplifier;

subtracting a sample of the input signal from the extracted sample of the output of the main amplifier thereby producing an error signal;

detecting the presence of the modulation source signal in the output of the feedforward amplifier; and adaptively modulating and amplifying the error signal, and combining the modulated and amplified error signal with the main amplifier output so as to minimize the presence of the modulation source signal in the output of the feedforward amplifier;

wherein the modulation source signal frequency is selected to result in sidebands that fall within the spectral nulls of the signal mixed with itself.

9. A method of reducing distortion in a feedforward amplifier output signal, the method comprising:

receiving an input signal;

modulating the input signal with a modulation source signal;

delivering the modulated input signal to a main amplifier to produce an output;

extracting a sample of the output of the main amplifier;

subtracting a sample of the input signal from the extracted sample of the output of the main amplifier thereby producing an error signal;

detecting the presence of the modulation source signal in the output of the feedforward amplifier; and adaptively modulating and amplifying the error signal, and combining the modulated and amplified error signal with the main amplifier output so as to minimize the presence of the modulation source signal in the output of the feedforward amplifier;

wherein adaptively modulating and amplifying of the error signal is in response to scalar parameters derived from vector outputs of detectors sensing the presence of the modulating source in the power amplifier output.

10. A method of reducing distortion in a feedforward amplifier output signal, the method comprising:

receiving an input signal;

modulating the input signal with a modulation source signal;

delivering the modulated input signal to a main amplifier to produce an output;

extracting a sample of the output of the main amplifier;

subtracting a sample of the input signal from the extracted sample of the output of the main amplifier thereby producing an error signal;

detecting the presence of the modulation source signal in the output of the feedforward amplifier; and adaptively modulating and amplifying the error signal, and combining the modulated and amplified error signal with the main amplifier output so as to minimize the presence of the modulation source signal in the output of the feedforward amplifier;

wherein adaptively modulating and amplifying of the error signal is performed in response to a matrix sensitivity derived from vector error versus phase and amplitude outputs of detectors sensing the presence of the modulating source in the main amplifier output.

11. A method as defined in claim 10, wherein the matrix sensitivity derived from the vector error versus phase and amplitude outputs of the detectors is fixed.

12. A method as defined in claim 10, wherein the matrix sensitivity derived from the vector error versus phase and amplitude adjusters is stored in a lookup table.

13. A method of reducing distortion in a feedforward amplifier output signal, the method comprising:

receiving an input signal;

modulating the input signal with a modulation source signal;

delivering the modulated input signal to a main amplifier to produce an output;

extracting a sample of the output of the main amplifier;

subtracting a sample of the input signal from the extracted sample of the output of the main amplifier thereby producing an error signal;

detecting the presence of the modulation source signal in the output of the feedforward amplifier; and adaptively modulating and amplifying the error signal, and combining the modulated and amplified error signal with the main amplifier output so as to minimize the presence of the modulation source signal in the output of the feedforward amplifier;

wherein adaptation is stopped, or retarded, when the input signal level decreases below a threshold.

14. A feedforward amplifier comprising:

a first loop modulator configured to accept an input signal and output a modulated primary signal in response to a modulation source and a first loop controller;

a main amplifier configured to accept the modulated primary signal and output a power amplifier signal;

a first loop directional coupler configured to extract a sample of the power amplifier signal;

a power combiner configured to accept, and combine, the input signal and the extracted sample of the power amplifier signal and to output a distortion signal;

a second loop modulator configured to accept the distortion signal, adjust the distortion signal in response to a second loop controller, and to output a modulated distortion signal;

an error amplifier configured to accept, and amplify, the modulated distortion signal and output a correction signal;

a power directional coupler configured to accept the correction signal and the power amplifier signal and output a power signal;

a power signal sense directional coupler configured to extract a sample of the power signal;

a detection circuit configured to accept the sample of the power signal and detect the amplitude of the modulation signal present in the power signal;

a sense signal directional coupler configured to extract a sample of the input signal; and an automatic gain control circuit configured to accept the sample of the sense signal and to output a voltage level used to adjust gains in the detector circuit and monitored by the first loop controller and the second loop controller.

15. A feedforward amplifier as defined in claim 14, wherein the modulation source has a frequency between about 100 Hz and about 100 kHz.

16. A feedforward amplifier as defined in claim 14, wherein the modulation source has a frequency that occurs at about a spectral null of the input signal mixed with itself.

17. A feedforward amplifier as defined in claim 14, wherein the first loop modulator comprises a variable attenuator.

18. A feedforward amplifier as defined in claim 14, wherein the first loop modulator comprises is a variable gain amplifier.

19. A feedforward amplifier as defined in claim 14, wherein the first loop modulator comprises a phase shifter.

20. A feedforward amplifier as defined in claim 14, wherein the second loop modulator is a vector I/Q modulator.

21. A feedforward amplifier as defined in claim 14, wherein the second loop modulator comprises a variable gain amplifier.

22. A feedforward amplifier as defined in claim 14, wherein the second loop modulator comprises a phase shifter.

23. A feedforward amplifier as defined in claim 14, wherein the second loop modulator is a vector I/Q modulator.

24. A feedforward amplifier as defined in claim 14, wherein the detection circuit is a synchronous detector.

25. A feedforward amplifier as defined in claim 14, wherein the modulated primary signal is amplitude modulated.

26. A feedforward amplifier as defined in claim 14, wherein the modulated primary signal is phase modulated.

27. A feedforward amplifier as defined in claim 14, wherein the modulated primary signal is single sideband modulated.

* * * * *

UNITED STATES PATENT AND TRADEMARK OFFICE
CERTIFICATE OF CORRECTION

PATENT NO. : 6,525,603 B1
DATED : February 25, 2003
INVENTOR(S) : Morgan

It is certified that error appears in the above-identified patent and that said Letters Patent is hereby corrected as shown below:

Column 11,
Lines 39-41, please replace claim 2 with the following claim:
    2. A method as defined in claim 1, wherein the single additional sideband is about 30 dB below the carrier signal amplitude.

Column 15,
Lines 20-22, please replace claim 18 with the following claim:
    18. A feedforward amplifier as defined in claim 14, wherein the first loop modulator comprises a variable gain amplifier.

Signed and Sealed this

Fifth Day of August, 2003

JAMES E. ROGAN
*Director of the United States Patent and Trademark Office*